United States Patent
Kauppinen et al.

(10) Patent No.: US 6,780,684 B2
(45) Date of Patent: Aug. 24, 2004

(54) STABILIZED TUNNEL JUNCTION COMPONENT

(75) Inventors: Juha Kauppinen, Jyväskylä (FI); Jukka Pekola, Jyväskylä (FI); Antti Manninen, Jyväskylä (FI)

(73) Assignee: Nanoway Oy, Jyvaskyla (FI)

(*) Notice: Subject to any disclaimer, the term of this patent is extended or adjusted under 35 U.S.C. 154(b) by 0 days.

(21) Appl. No.: 10/168,059

(22) PCT Filed: Dec. 22, 2000

(86) PCT No.: PCT/FI00/01138

§ 371 (c)(1), (2), (4) Date: Jun. 17, 2002

(87) PCT Pub. No.: WO01/47042

PCT Pub. Date: Jun. 28, 2001

(65) Prior Publication Data

US 2002/0192880 A1 Dec. 19, 2002

(30) Foreign Application Priority Data

Dec. 22, 1999 (FI) .................................................. 992757

(51) Int. Cl.[7] ............................................. H01L 21/332
(52) U.S. Cl. ..................................... 438/136; 438/135
(58) Field of Search ........................................ 438/136

(56) References Cited

U.S. PATENT DOCUMENTS

| | | |
|---|---|---|
| 4,439,269 A | 3/1984 | Cukauskas |
| 4,692,997 A | 9/1987 | Calviello |
| 5,161,955 A | 11/1992 | Danielson et al. |
| 5,947,601 A | 9/1999 | Pekola |
| 5,970,370 A * | 10/1999 | Besser et al. ............... 438/586 |
| 5,974,806 A | 11/1999 | Pekola et al. |
| 6,541,316 B2 * | 4/2003 | Toet et al. .................. 438/166 |
| 6,642,539 B2 * | 11/2003 | Ramesh et al. .............. 257/43 |

FOREIGN PATENT DOCUMENTS

| | | |
|---|---|---|
| EP | 0285445 | 5/1988 |
| JP | 54157496 | 12/1979 |
| JP | 58141584 | 8/1983 |

\* cited by examiner

*Primary Examiner*—David Nelms
*Assistant Examiner*—Thao P. Le
(74) *Attorney, Agent, or Firm*—Fildes & Outland, P.C.

(57) ABSTRACT

A method for stabilizing a tunnel junction component, in which a mask is formed on the surface of a substrate, and conductors are constructed by evaporation onto the substrate in an evaporation chamber, and at least one thin oxide layer element is oxidized on top of a selected conductor. This remains partly under the following conductor, thus forming a tunnel junction element with those conductors and titanium (Ti) or another gettering substance is evaporated on top of the said following conductor, before the tunnel junction component is removed from the evaporation chamber, when the titanium layer thus created protects the tunnel junction element from the detrimental effects of air molecules.

8 Claims, 1 Drawing Sheet

STABILIZED TUNNEL JUNCTION COMPONENT

TECHNICAL FIELD

The present invention relates to a method for stabilizing a tunnel junction component and a corresponding stabilized tunnel junction component, in which method a mask is formed on the surface of a substrate and conductors are built on the substrate by evaporation and at least one thin oxide layer element is oxidized on top of a selected conductor and remains partly under the next conductor, thus forming a tunnel junction element between these conductors, and which element is provided with contacts and cased.

BACKROUND OF THE INVENTION

U.S. Pat. Nos. 5,947,601 and 5,974,806 disclose certain thin film constructions exploiting tunnel junctions. It has been observed that ambient air often has a corrosive effect on nano and less-than-micron-sized thin film conductors. The long-term instability is largely due to the large surface-area/volume ratio of these small structures. This problem acquires central importance with the increase in the number of nano-electronic sensors, which should remain stable for a number of years. This instability has been quite clearly observed in the 'Coulomb blockade' nano thermometer (CBT) and micro cooler disclosed in the publications referred to above. It has become apparent that normal hermetically sealed cases for microelectronic sensors and other components are unsuitable and insufficient in these cases, so that the aging problem requires a more developed solution.

The variation in the resistance of a CBT sensor signifies an increase in dispersion in the junction parameters, thus reducing the absolute accuracy. A relative change of 10% in the resistance of the sensor has been observed to cause a maximum change of 0.5% in absolute accuracy.

Sensors and other components of this kind cannot generally be installed in metal capsules, as this increases the size and mass, as well as demanding non-magnetic materials and involving a risk of overheating when closing the capsule. It is also difficult to use protective gases, because an extremely high degree of purity would be required, which is difficult to maintain in a small volume. It is also difficult to create and maintain a sufficient vacuum in a small volume.

It is difficult to use a coating substance to protect a component, as the protection cannot be carried out before removing the evaporation mask, which requires the component to be taken from the evaporation chamber to an air space, which would mean the continuation of aging after manufacture, despite the coating protection.

In the above publications, a line width of typically 200 nm, generally 0.01–10 micrometers (10–10 000 nm), is used in the tunnel junction. In the thermometer, the length of the tunnel junction is typically 300 nm. The thickness of the oxide forming a tunnel junction is extremely small, typically only about 1 nm. This is considerably less than the sizes, for example, in the P and N elements doped in a silicon chip, which are used in conventional microcircuits (memories, processors, and digital and analog circuits in general).

SUMMARY OF THE INVENTION

The present invention provides a manufacturing method for stabilizing tunnel junction components and a stabilized tunnel junction component, which will solve the aging problem. The characteristic features of a manufacturing method according to the invention in which a mask is formed on the surface of a substrate, and conductors are constructed by evaporation onto the substrate in an evaporation chamber, and at least one thin oxide layer element is oxidized on top of a selected conductor, which remains partly under the following conductor, thus forming a tunnel junction element with those conductors, and which tunnel junction component is provided with contacts and cased, is characterized in that titanium (Ti) or another gettering substance is vaporized on top of the said following conductor, before the tunnel junction component is removed from the evaporation chamber, when the titanium layer thus created protects the tunnel junction element from the detrimental effects of air molecules, both in the later stages of the manufacture of the tunnel junction component and as a finished component.

Correspondingly, the characteristic features of a tunnel junction according to the invention in which there are conductors on the surface of the substrate and at least one oxide layer between two overlapping conductors, thus forming a tunnel junction element with them, and in which the tunnel junction component includes contacts to connect it to external circuits, is characterized in that there is a titanium layer (Ti) on top of the uppermost conductor.

According to the invention, the tunnel junction can be protected immediately after manufacture, before the tunnel junction component is removed from the evaporation chamber. The titanium layer appears to have the effect that the thin oxide layer is no longer able to grow, on account of the air molecules, especially the oxygen and water molecules, because the titanium layer gathers the molecules into itself. Some other substance, particularly a metal, with similar gettering properties can be used. The reactivity of the getter must be essentially greater than that of the substance used in the conductor layer. In the same way as titanium (Ti), the other substance absorbs the oxygen and water molecules in the air into itself. However, it is important that the materials used in manufacture and the uncased component are not exposed to moisture.

According to one preferred application, the uppermost conductor is oxidized before the titanium layer is evaporated, so that the titanium layer cannot substantially affect the electrical values of the circuit. According to a second preferred application, the titanium layer is coated already in the same stage with a layer of copper or other metal, so that the titanium layer does not become saturated when the tunnel junction component must be removed from the evaporation chamber to remove the mask.

In the following, the invention is described with reference to the accompanying figures, which show the problem underlying the invention and the construction of a tunnel junction component according to the invention.

DETAILED DESCRIPTION OF THE INVENTION

Figure 1:
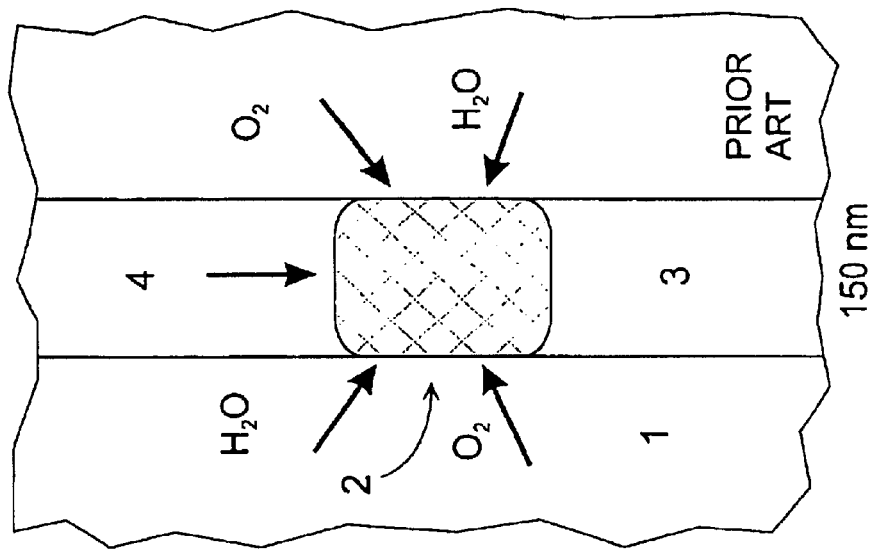
FIG. 1 shows the problem situation in a tunnel junction component according to the prior art.

The tunnel junction 2 according to FIG. 1 is quite small in size. The overlapping part of conductors 3 and 4 formed on substrate 1 is typically only 200×300 mm. The thickness of the oxide layer formed on top of the bottommost conductor is even less, being only about 1 nm. This thin layer of oxide then remains to insulate conductors 3 and 4 from each other. The stability of tunnel junction 2 depends greatly on the stability of this oxide layer. According to FIG. 1, it is apparent that oxygen ($O_2$) and water ($H_2O$) molecules penetrate tunnel junction 2 from the side and thicken the oxide layer, causing its properties to deteriorate over time. As such, the precise mechanism of this effect is not known.

Figure 2:
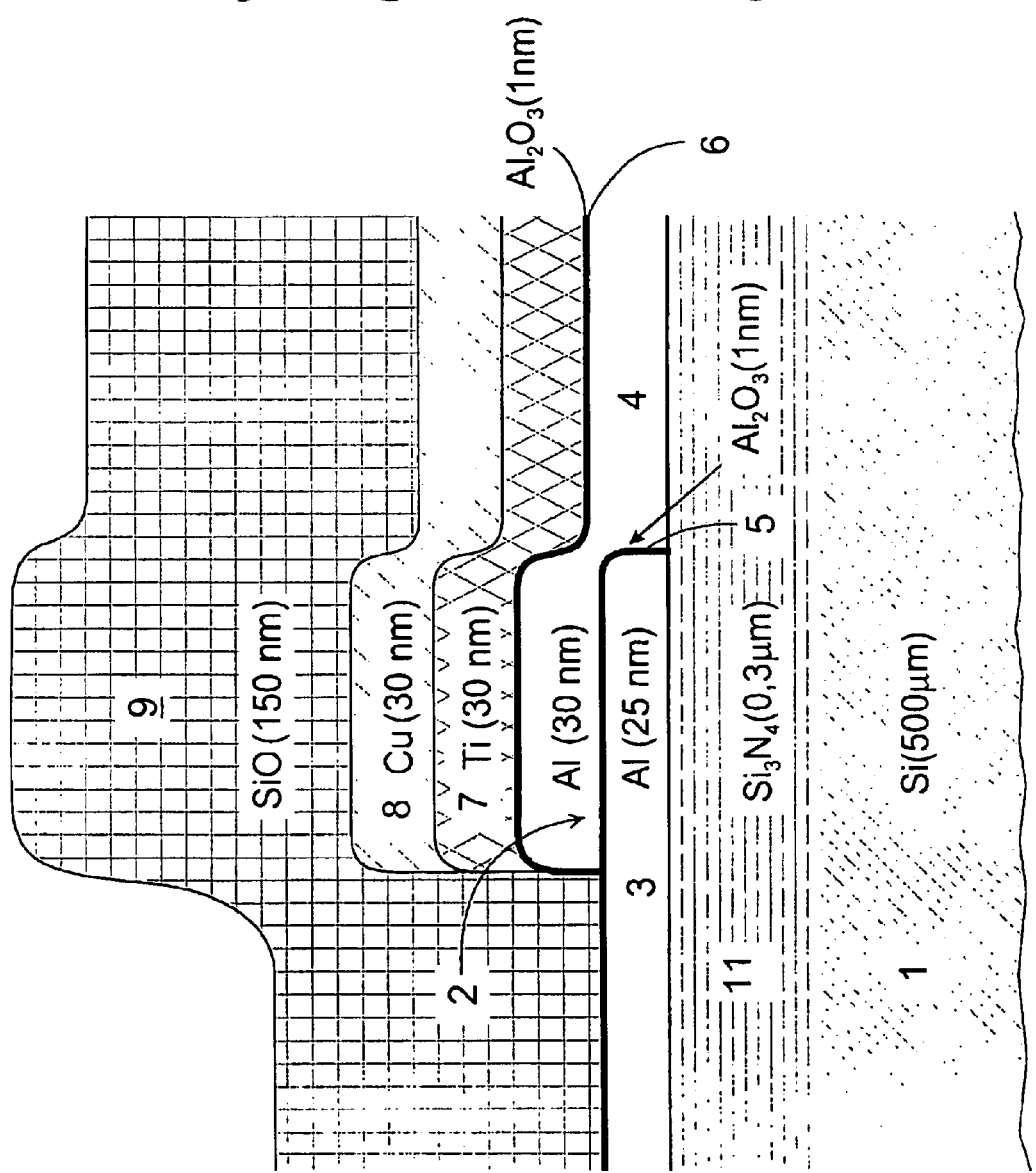
FIG. 2 shows the construction of a tunnel junction of the tunnel junction component according to the invention in detail.

In this case, the substrate of the tunnel junction component is passive and does not affect the electrical properties of the component, FIG. 2. Silicon (Si) is generally used as the substrate 1, on the surface of which a thin (0.1–2 $\mu$m) layer 11 of silicon nitride ($Si_3N_4$) or silicon oxide ($SiO_2$) is grown. However, substrate 1 can be, for example, quartz or some other passive material.

The first conductor 3 is vaporized to the surface of the substrate by means of two angle evaporation. A thin oxide film 5 is formed on top of this by permitting a small amount of oxygen to enter the chamber. After that, the evaporation angle is changed and next conductor layer 4 is evaporated, partly overlapping the first conductor layer 3 in a manner that is, as such, known. Tunnel junction 2 is then formed between, and in conjunction with the overlapping conductor components 3 and 4. After the evaporation of the second conductor layer 4, a small amount of oxygen is again allowed to enter the evaporation chamber, when a second oxide layer 6 is formed. The second oxide layer 6 is used to prevent conductor component 4 and titanium layer 7 diffusing each other. Next, titanium 7 is evaporated at the same angle as the second conductor 4 was evaporated. Finally, copper 8 is evaporated at the same angle to protect the titanium 7, so that it will not saturate at room temperature. After this, the tunnel junction component can be removed from the evaporation chamber and its mask dissolved off. Finally, the tunnel junction component is put back in the evaporation chamber and a uniform layer of silicon monoxide 9 (SiO) is evaporated on top of the component. After this, the tunnel junction component can be removed from the chamber, provided with contacts, and cased in a manner that is known.

Generally, aluminium is used as the conductors 3 and 4, because aluminium reacts with oxygen to form a sufficiently thin and uniform oxide layer on its surface. As such, some other conductor may be used, for example, niobium (Nb).

The titanium layer 7 is 5–1000-nm thick, preferably 20–50 nm. A copper layer 8, with a thickness of 5–100 nm, preferably 20–50 nm, is used on top of titanium layer 7. The dimensions of the length and width of tunnel junction 2 are preferably in the range 50–2000 nm. The depth of the oxide layer 5 of tunnel junction 2 is preferably in the range 0.1–5 nm, most preferably 0.5–2 nm.

The oxide layer is usually aluminium oxide $Al_2O_3$, but other oxide compounds may be considered. The width of the line, which above was typically 0.2 $\mu$m, can be within the range 0.01–2 $\mu$m.

It is unclear how broadly the titanium layer 7 spreads to the sides of the junction and what is the exact mechanism of the effect, but in tests tunnel junction components according to the invention have retained their electrical properties unaltered over a test period of several tens of days, whereas the electrical properties of previous sensors began to alter immediately after manufacture, which made their use difficult.

As such, the method according to the invention can be adapted within the scope of the claims in many ways. For example, it is naturally possible to use multi angle evaporation instead of the above two angle evaporation.

Although the invention has been described by reference to a specific embodiment, it should be understood that numerous changes may be made within the spirit and scope of the inventive concepts described. Accordingly, it is intended that the invention not be limited to the described embodiment, but that it have the full scope defined by the language of the following claims.

What is claimed is:

1. A stabilized tunnel junction component, in which there are conductors on the surface of the substrate and at least one oxide layer between two overlapping conductors, thus forming a tunnel junction element with them, and in which the tunnel junction component includes contacts to connect it to external circuits, characterized in that there is a titanium layer (Ti) on top of the uppermost conductor.

2. A tunnel junction component according to claim 1, characterized in that there is a thin oxide layer between the titanium layer and the uppermost conductor.

3. A tunnel junction component according to claim 1, characterized in that the thickness of the titanium layer is 5–100 nm.

4. A tunnel junction component according to claim 1, characterized in that there is a copper layer, of a thickness of 5–100 nm, on top of the titanium layer.

5. A tunnel junction component according to claim 1, characterized in that in the tunnel junction component there is a silicon substrate, on the surface of which there is an insulating layer.

6. A tunnel junction component according to claim 5, wherein the insulating layer is a layer of silicon nitride $Si_3N_4$.

7. A tunnel junction component according to claim 1, characterized in that the width and length of the tunnel junction are within the range 50 nm –300 mu.

8. A tunnel junction component according to claim 1, characterized in that the depth of the oxide layer of the tunnel junction is in the range of 0.1 nm–5 mu.

* * * * *